(12) United States Patent
Miyakoshi et al.

(10) Patent No.: US 6,563,169 B1
(45) Date of Patent: May 13, 2003

(54) SEMICONDUCTOR DEVICE WITH HIGH WITHSTAND VOLTAGE AND A DRAIN LAYER HAVING A HIGHLY CONDUCTIVE REGION CONNECTABLE TO A DIFFUSED SOURCE LAYER BY AN INVERTED LAYER

(75) Inventors: Nobuki Miyakoshi, Hanno (JP); Masanori Fukui, Hanno (JP); Hideyuki Nakamura, Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 09/367,599

(22) PCT Filed: Apr. 9, 1999

(86) PCT No.: PCT/JP99/01885
§ 371 (c)(1),
(2), (4) Date: Aug. 18, 1999

(87) PCT Pub. No.: WO00/62345
PCT Pub. Date: Oct. 19, 2000

(51) Int. Cl.$^7$ .................. H01L 29/76; H01L 29/94; H01L 31/062; H01L 31/119
(52) U.S. Cl. ................ 257/339; 257/341; 257/342; 257/544
(58) Field of Search ................ 257/213, 263, 257/328, 329, 338, 339–342, 401, 500, 502, 544

(56) References Cited

U.S. PATENT DOCUMENTS

| 5,016,066 A | | 5/1991 | Takahashi ............ 357/23.4 |
| 5,256,893 A | * | 10/1993 | Yasuoka .............. 257/335 |
| 5,661,314 A | | 8/1997 | Merrill et al. ......... 257/144 |
| 5,742,087 A | * | 4/1998 | Lidow et al. .......... 257/339 |

FOREIGN PATENT DOCUMENTS

| JP | 1-253966 | 10/1989 |
| JP | 2-37777 | 2/1990 |
| JP | 7-169950 | 7/1995 |

* cited by examiner

Primary Examiner—Wael Fahmy
Assistant Examiner—Hoai Pham
(74) Attorney, Agent, or Firm—Armstrong, Westerman & Hattori, LLP.

(57) ABSTRACT

A highly conductive region 18 serving as a surface of a drain layer 2 of a first conductivity type is diffused more deeply than a main diffused layer 36 and a diffused channel layer 37, and has a small conducting resistance. The highly conductive region 18 is surrounded by a diffused region 40 of a second conductivity type which comprises a diffused base layer 38 and a diffused guard ring layer 13. Therefore, the highly conductive region 18 does not form spherical junctions, and a depletion layer spreading in the highly conductive region 18 extends into the highly conductive region 18. The highly conductive region 18 thus has a high withstand voltage while maintaining the low conducting resistance.

23 Claims, 18 Drawing Sheets

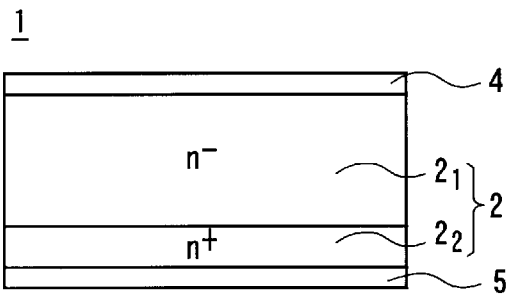
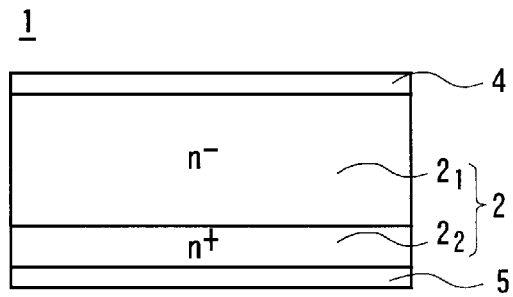
Fig.1a    Fig.1b
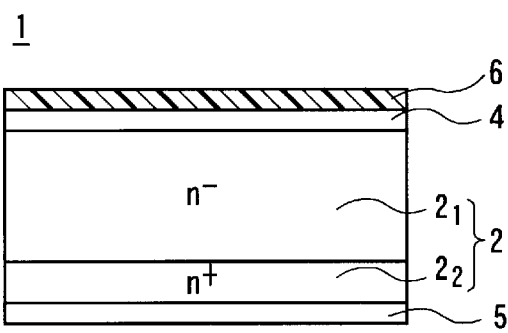
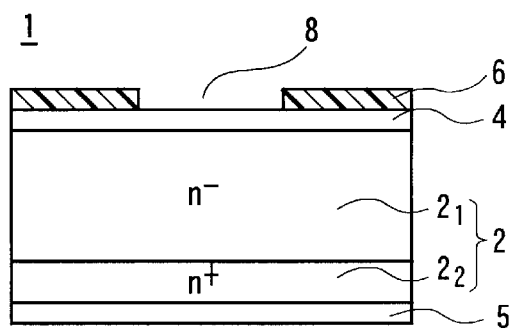
Fig.2a    Fig.2b
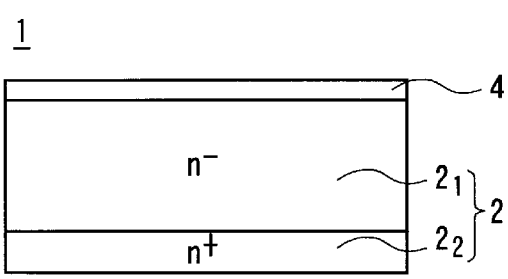
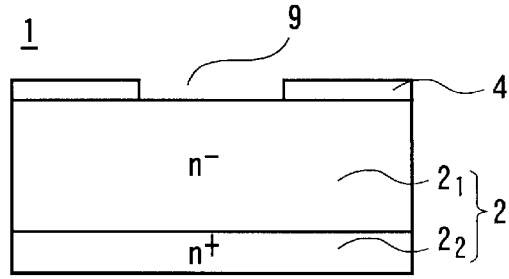
Fig.3a    Fig.3b
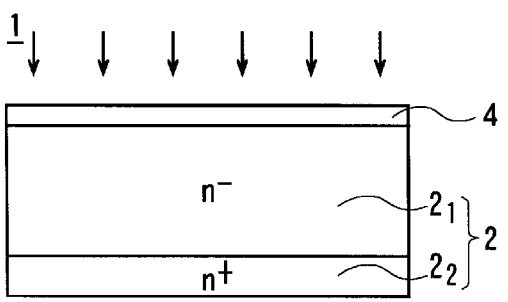
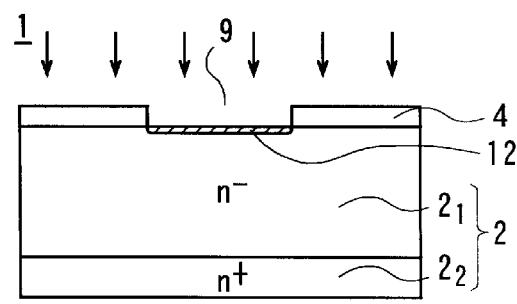
Fig.4a    Fig.4b

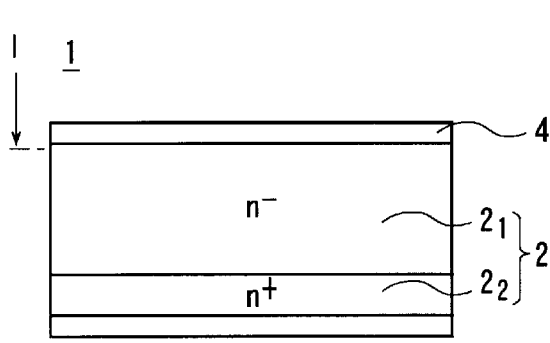
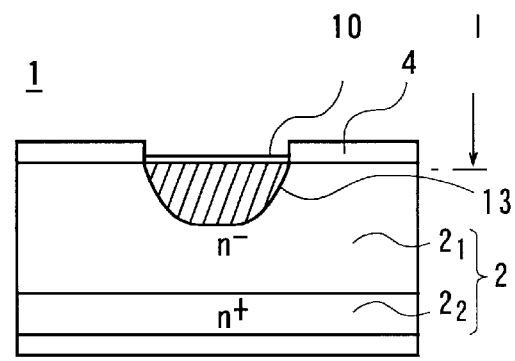
Fig. 5a　　　　　　Fig. 5b
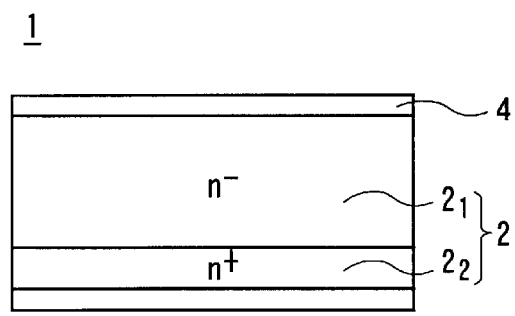
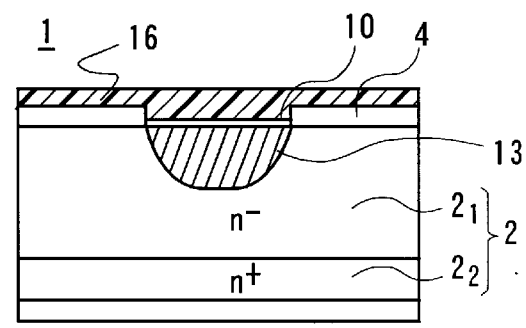
Fig. 6a　　　　　　Fig. 6b
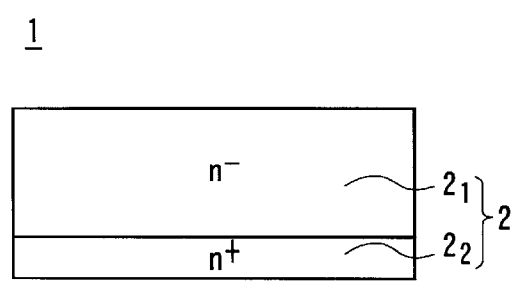
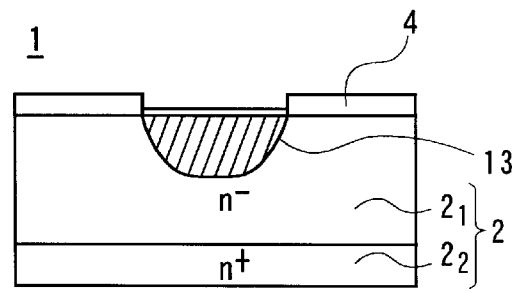
Fig. 7a　　　　　　Fig. 7b

US 6,563,169 B1

SEMICONDUCTOR DEVICE WITH HIGH WITHSTAND VOLTAGE AND A DRAIN LAYER HAVING A HIGHLY CONDUCTIVE REGION CONNECTABLE TO A DIFFUSED SOURCE LAYER BY AN INVERTED LAYER

BACKGROUND OF THE INVENTION

1. Field of the Invention

The present invention relates to a power semiconductor device, and more particularly to a semiconductor device having a high withstand voltage.

2. Description of the Revelant Art

Heretofore, high-speed, high-withstand voltage semiconductor devices are used in apparatus for switching large currents in power supplies or the like. FIG. 33 of the accompanying drawings shows a semiconductor chip 101 of MOSFET which is generally used as one of those conventional semiconductor devices.

As shown in FIG. 33, the semiconductor chip 101 is made of a single crystal of silicon and has a drain layer 102 comprising an n⁻ layer $102_1$ of high resistance, an n⁻ layer $102_2$ of low resistance which is of the same conductivity type as the n⁻ layer $102_1$, and a highly conductive region 103.

The n⁻ layer $102_2$ is positioned centrally in the drain layer 102, the n⁺ layer $102_2$ in a back side of the drain layer 102, and the highly conductive region 103 in a face side of the drain layer 102. If an n type is a first conductivity type, then a number of p-type diffused base layers 108 which are of a second conductivity type are disposed on the surface of the highly conductive region 103.

The diffused base layers 108, each of a square shape, are arranged in a matrix. As shown in FIG. 34 of the accompanying drawings, each of the diffused base layers 108 comprises a central main diffused layer 106 having a large diffusion depth and a channel region 107 having a small diffusion depth and surrounding the main diffused layer 106. Therefore, each of the diffused base layers 108 is deeper in its central area and shallower in its peripheral area.

A ring-shaped n-type diffused source layer 105 is disposed in each of the diffused base layers 108. A gate insulating film 104 comprising a silicon oxide film and a gate electrode film 110 are deposited in the order named on the surfaces of the channel regions 107. When a positive voltage is applied to the gate electrode film 110, an n-type inverted layer is developed in the surface of the p-type channel region 107, electrically connecting the diffused source layer 105 and the highly conductive region 103 to each other.

The semiconductor chip 101 also has a source electrode film 111 and a drain electrode film 112 which are prevented from being short-circuited by an interlayer insulating film 115.

The MOSFET shown in FIG. 33 has a higher operating speed than bipolar transistors, and suffers a small current concentration upon transition from a conducted state to a cut-off state, allowing a semiconductor device having a high withstand voltage to be easily fabricated.

When a conducting current flows in the semiconductor chip 101, the resistance of the drain layer 102 and the resistance of a JFET between the diffused base layers 108 are effective enough to cause a larger loss than bipolar transistors.

With the highly conductive region 103 in the face side of the drain layer 102, the resistance of the drain layer 102 is reduced, resulting in a reduction in the forward resistance of the MOSFET. The withstand voltage of the MOSFET is lowered because a depletion layer is less liable to spread in the highly conductive region 103.

In a pn junction made up of the diffused base layer 108 and the highly conductive region 103, as shown in FIG. 35a of the accompanying drawings, depletion layers 120 tending to spread into the highly conductive region 103 are less liable to spread in the highly conductive region 103 as the highly conductive region 103 is of a higher concentration.

Generally, pn junctions are classified into planar junctions, cylindrical junctions, and spherical junctions in terms of the configuration of a diffused layer of higher concentration. Cylindrical junctions are formed on confronting sides of the channel regions 107, whereas spherical junctions are formed on vertexes of the channel regions 107.

It is known that the pn junctions have a withstand voltage which is progressively smaller in the order of planar junctions, cylindrical junctions, and spherical junctions. The withstand voltage of the pn junction between the diffused base layers 108 and the highly conductive region 103 is determined by the spherical junctions on vertexes of the diffused base layers 108. Particularly, an avalanche breakdown tends to occur on the surface of the highly conductive region 103.

If confronting diffused base layers 108 are displaced closely to each other until two depletion layers 120 extending in the highly conductive region 103 are brought into contact each other, then when a reverse bias greater than the voltage at which the depletion layers 120 contact each other is applied, the depletion layers 120 spread in their depth, and hence the withstand voltage is determined at a position deeper than the surface of the highly conductive region 103.

In this case, the withstand voltage is higher than if an avalanche breakdown occurs when the confronting diffused base layers 108 are spaced from other and before the depletion layers 120 contact each other.

With the conventional MOSFET, however, as shown in FIG. 35b of the accompanying drawings, a reverse biased state between the drain layer 102 and the diffused base layers 108 is so large that even when the depletion layers 120 are held in contact with each other between the sides of the channel regions 107, the depletion layers 120 are kept out of contact with each other between the vertexes of the channel regions 107 because the distance between the vertexes is large, so that the withstand voltage of the spherical junctions will not increase. The pn junctions are thus subjected to a breakdown in surface areas 111, tending to break the semiconductor device.

It is therefore an object of the present invention to provide a semiconductor device having a high withstand voltage.

Another object of the present invention is to provide a semiconductor device whose withstand voltage can be increased while preventing a conducting resistance from being increased.

SUMMARY OF THE INVENTION

According to the present invention, there is provided a semiconductor device having a drain layer of a first conductivity type formed in a semiconductor subtrate, the first conductivity type being either a p type or an n type of semiconductor, and a second conductivity type being the other of the p type or the n type, a diffused base layer of the second conductivity type formed in a surface of said drain layer, and a diffused source layer of the first conductivity type formed in a surface of said diffused base layer, said diffused base layer having a portion as a channel region between said diffused source layer and said drain layer, said channel region having on a surface thereof a gate insulating film and a gate electrode film, the arrangement being such that when a voltage is applied to said gate electrode film, forming an inverted layer in the surface of said channel region, said diffused source layer and said drain layer are electrically connected to each other by said inverted layer, characterized in that a portion of said drain layer which is connected to the diffused source layer by at least said inverted layer has a highly conductive region having a resistance lower than said drain layer and the same conductivity type as said drain layer, said highly conductive region having a surface surrounded by a diffused layer of the second conductivity type including said diffused base layer.

The surface of said highly conductive region may be divided into a plurality of regions by the diffused layer of the second conductivity type including said diffused base layer.

The diffused base layer may have a main diffused layer which is of the same conductivity type as said diffused base layer and is diffused to a depth greater than said diffused base layer, said highly conductive region being diffused to a depth greater than the depth to which said main diffused layer is diffused.

The semiconductor device may further comprise a diffused guard ring layer disposed around an outer peripheral portion of said diffused base layer, said diffused guard ring layer being of the same conductivity type as said diffused base layer and diffused to a depth greater than the depth to which said main diffused layer is diffused. The diffused guard ring layer may be held in contact with a base region. Another diffused guard ring layer may be disposed outside of the above diffused guard ring layer in spaced relationship thereto.

The surface of the highly conductive region of the first conductivity type may have an outer peripheral portion held in contact with said diffused layer of the second conductivity type which includes the diffused guard ring layer and the diffused base layer. The highly conductive region may be brought into contact with the diffused layer of the second conductivity type when a window is opened in an insulating film for forming an impurity layer to form the highly conductive region, or the highly conductive region and the diffused layer of the second conductivity type may be brought into contact with each other by the diffusion of an impurity in the lateral direction of the substrate when an impurity layer is diffused to form the highly conductive region.

Furthermore, a drain electrode film may be disposed on either a face side or a back side of said semiconductor substrate and electrically connected to said drain layer.

With the above arrangement of the present invention, if a first conductivity type is either a p type or an n type of semiconductor, and a second conductivity type being the other of the p type or the n type, then a diffused base layer of the second conductivity type is formed in a surface of a drain layer of the first conductivity type, and a diffused source layer of the first conductivity type is formed in said diffused base layer of the second conductivity type, among said diffused layer of the second conductivity type, regions between said diffused source layer and said drain layer being a channel region.

The channel region has on a surface thereof a gate insulating film and a gate electrode film. When a voltage is applied to said gate electrode film, forming an inverted layer in the surface of said channel region, said diffused source layer and said drain layer are electrically connected to each other by said inverted layer, and a current flows between the diffused source layer and the drain layer.

A surface portion of said drain layer which is connected to the diffused source layer by said inverted layer has a highly conductive region having a resistance lower than that in deep portion of said drain layer, reducing a conducting resistance.

In conventional semiconductor devices, the diffused base layer of the second conductivity type is surrounded by the highly conductive region. According to the present invention, however, the highly conductive region is surrounded by the diffused base layer of the second conductivity type. Therefore, a pn junction between the highly conductive region and the diffused base layer of the second conductivity type has no spherical junction, and has a high withstand voltage. In the pn junction, the depletion layer in the highly conductive region spreads into the highly conductive region from the outer peripheral portion thereof.

Since no spherical junction is present, the impurity concentration of the highly conductive region can be increased while maintaining its high withstand voltage. The withstand voltage is not reduced even if the highly conductive region is deeply formed. Particularly if the diffused base layer of the second conductivity type is joined to the channel region and has a deeper main diffused layer than the channel region, then the high withstand voltage can be maintained even though the depth of the highly conductive region is greater than the depth of the main diffused layer to reduce the effect of a JFET formed between diffused layers of the second conductivity type.

An example of an impurity concentration distribution in the direction of the depth of the main diffused layer is shown in FIG. 30 of the accompanying drawings. The horizontal axis of FIG. 30 represents the diffused depth and the vertical axis thereof represents the impurity concentration. Since the highly conductive region is diffused into the drain layer of the same conductivity type, the diffused depth thereof should be defined. According to the present invention, the diffused depth of the highly conductive region is where the impurity concentration of the drain layer is twice the impurity concentration before the highly conductive region is formed. In FIG. 30, the depth of the main diffused layer is about 3.8 $\mu$m, whereas the depth of the highly conductive region exceeds 3.8 $\mu$m.

The relationship between the diffused depth, the on resistance $R_{on}$ per unit area, and the breakdown voltage $V_{DSS}$ of the highly conductive region is shown in the graph of FIG. 31 of the accompanying drawings. In the graph, a straight line $l_1$ represents the relationship between the on resistance $R_{on}$ and the breakdown voltage $V_{DSS}$ in the case where the highly conductive region is formed only in the vicinity of the surface, as shown in FIG. 32a of the accompanying drawings. A straight line $l_2$ represents the relationship between the on resistance $R_{on}$ and the breakdown voltage $V_{DSS}$ in the case where the diffused depth of the highly conductive region is greater than the diffused depth shown in FIG. 32a, but smaller than the diffused depth of the main diffused layer, as shown in FIG. 32b of the accompanying drawings. A straight line $l_3$ represents the relationship between the on resistance $R_{on}$ and the breakdown voltage $V_{DSS}$ in the case where the diffused depth of the highly conductive region is smaller than the depth of a main junction, as shown in FIG. 32c of the accompanying drawings.

The graph shown in FIG. 31 indicates that as the breakdown voltage $V_{DSS}$ increases, the on resistance $R_{on}$ increases, and the on resistance $R_{on}$ is smaller as the depth of the highly conductive region is greater for the same breakdown voltage $V_{DSS}$.

In the case where the highly conductive region of the first conductivity type is formed within the diffused layer of the second conductivity type including the diffused base layer, then a depletion layer in a high-resistance portion of the drain layer tends to spread easily thereby to increase the withstand voltage if the outer side of the diffused layer of the second conductivity type forms a pn junction with the high-resistance portion of the drain layer. The withstand voltage is made higher if the four corners of the diffused base layer of the second conductivity type are rounded so as not to produce spherical junctions, and also if a diffused guard ring of the second conductivity type having a diffused depth greater than the main diffused layer is disposed around the diffused base layer.

The diffused guard ring layer may be held in or out of contact with the diffused base layer of the second conductivity type. The first diffused guard ring layer may be held in contact with the diffused base layer of the second conductivity type, and the second diffused guard ring layer may be disposed around the first diffused guard ring layer out of contact therewith.

These and other features of the invention wil be understood upon reading of the following description along with the drawings.

BRIEF DESCRIPTION OF THE DRAWINGS

FIG. 1*a* is a cross-sectional view showing a step of manufacturing an active region;

FIG. 1*b* is a cross-sectional view showing a step of manufacturing a withstand voltage region;

FIG. 2*a* is a cross-sectional view showing a step of manufacturing the active region, following the step shown in FIG. 1*a*;

FIG. 2*b* is a cross-sectional view showing a step of manufacturing the withstand voltage region, following the step shown in FIG. 1*b*;

FIG. 3*a* is a cross-sectional view showing a step of manufacturing the active region, following the step shown in FIG. 2*a*;

FIG. 3*b* is a cross-sectional view showing a step of manufacturing the withstand voltage region, following gbthe step shown in FIG. 2*b*;

FIG. 4*a* is a cross-sectional view showing a step of manufacturing the active region, following the step shown in FIG. 3*a*;

FIG. 4*b* is a cross-sectional view showing a step of manufacturing the withstand voltage region, following the step shown in FIG. 3*b*;

FIG. 5*a* is a cross-sectional view showing a step of manufacturing the active region, following the step shown in FIG. 4*a*;

FIG. 5*b* is a cross-sectional view showing a step of manufacturing the withstand voltage region, following the step shown in FIG. 4*b*;

FIG. 6*a* is a cross-sectional view showing a step of manufacturing the active region, following the step shown in FIG. 5*a*;

FIG. 6*b* is a cross-sectional view showing a step of manufacturing the withstand voltage region, following the step shown in FIG. 5*b*;

FIG. 7*a* is a cross-sectional view showing a step of manufacturing the active region, following the step shown in FIG. 6*a*;

FIG. 7*b* is a cross-sectional view showing a step of manufacturing the withstand voltage region, following the step shown in FIG. 6*b*;

DETAILED DESCRIPTION OF THE PREFERRED EMBODIMENTS

Figure 8:
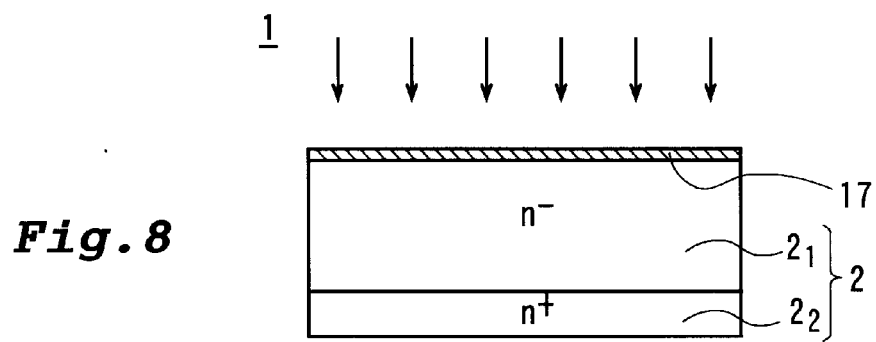
FIG. 8 is a cross-sectional view showing a step of manufacturing the active region, following the step shown in FIG. 7*a*.

A MOSFET according to an embodiment of the present invention and a process of manufacturing the same will be described below.

FIGS. 1a through 7a and FIGS. 8 through 20 show a process of manufacturing an active region (a central portion of the MOSFET), and FIGS. 1b through 7b show a process of manufacturing a withstand voltage region (a peripheral portion of the MOSFET.

In FIGS. 1a through 7a and FIGS. 1b through 7b, a semiconductor chip 1 of MOSFET has a drain layer 2 comprising a silicon substrate. The drain layer 2 has an n⁻ layer $2_1$ of high resistance and an n⁺ layer $2_2$ of relatively low resistance which is positioned on a back side of the n⁻ layer $2_1$.

The semiconductor chip 1 is heat-treated to form an oxide film 4 on the surface of the drain layer 2, i.e., the surface of the n⁻ layer $2_1$, as shown in FIGS. 1a and 1b. Then, a patterned resist film 6 is formed on the oxide film 4.

As shown in FIG. 2a, the oxide film 4 in the active region is fully covered with the resist film 6. As shown in FIG. 2b, the resist film 6 on the oxide film 4 in the withstand voltage region has an opening 8 defined therein. When the assembly is etched, the oxide film 4 exposed at the bottom of the opening 8 is removed, forming a window 9, as shown in FIG. 3b. At this time, an oxide film 5 on the back side of the drain layer 2, i.e., the surface of the n⁺ layer $2_2$, is removed in its entirety. The oxide film 4 in the active region remains unchanged, as shown in FIG. 3a.

The n⁻ layer $2_1$ is exposed at the bottom of the window 9. When a p-type impurity (boron in this embodiment) is injected into the n⁻ layer $2_1$, a shallow p-type impurity layer 12 is formed in the surface of the n⁻ layer $2_1$, as shown in FIG. 4b. At this time, no impurity is injected into the active region because the surface of the active region is covered with the oxide film 4, as shown in FIG. 4a.

Then, the assembly is heat-treated to diffuse the shallow impurity layer 12 to form first and second diffused guard ring layers 13, 14 in the drain layer 2 (FIGS. 5a and 5b). At this time, an oxide film 10 is formed.

Figure 23:
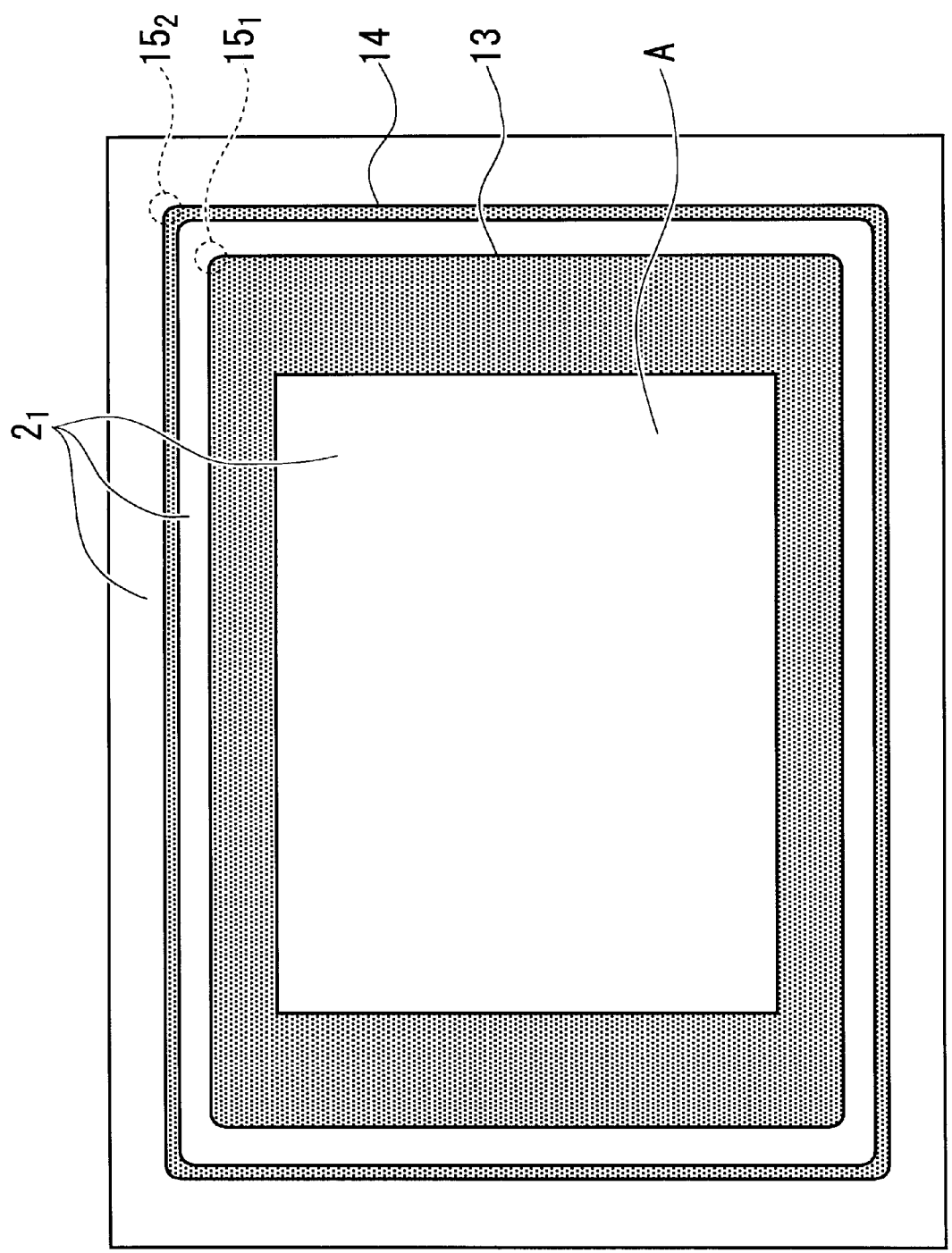
FIG. 23 is a plan view showing a pattern of first and second diffused guard ring layers.

The first and second diffused guard ring layers 13, 14 are shown in plan in FIG. 23, which corresponds to a cross-sectional view taken along line I—I of FIGS. 5a and 5b. In FIG. 23, the active region is indicated as a blank area A, and the withstand voltage region as the remaining area.

The resist film 6 is patterned to form the first diffused guard ring layer 13 as a substantially ring-shaped layer and also to form the second diffused guard ring layer 14 as a layer spaced from and extending around the first diffused guard ring layer 13. The first and second diffused guard ring layers 13, 14 have four corners $15_1$, $15_2$ which are rounded so as not to produce spherical junctions.

Then, with the silicon oxide film 4 exposed in the active region, a patterned resist film 16 is formed to cover the withstand voltage region only, as shown in FIGS. 6a and 6b. After the assembly is etched, the resist film 16 is removed, exposing the surface of the n⁻ layer $2_1$ in the active region, as shown in FIG. 7a. The withstand voltage region remains unchanged, i.e., covered with the oxide film 4, as shown in FIG. 7b.

As described above, after the first and second diffused guard ring layers 13, 14 are formed, the withstand voltage region remains substantially unchanged. Therefore, only diffused layer cross sections in the active region are shown in FIGS. 8 through 20.

With the withstand voltage region covered with the resist film and the surface of the n⁻ layer $2_1$ exposed in the active region, an n-type impurity is injected to form a shallow impurity layer 17 in the surface of the n⁻ layer $2_1$ in the active region, as shown in FIG. 8.

Figure 9:
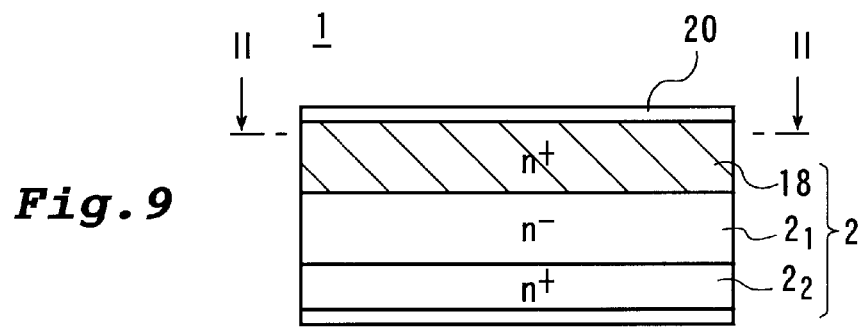
FIG. 9 is a cross-sectional view showing a step of manufacturing the active region, following the step shown in FIG. 8.

When the assembly is then heat-treated, the shallow impurity layer 17 is diffused, forming a highly conductive region 18, as shown in FIG. 9. The highly conductive region 18, the n⁻ layer $2_1$ and the n⁺ layer $2_2$ are of the same conductivity type. The drain layer 2 comprises the highly conductive region 18, the n⁻ layer $2_1$, and the n⁺ layer $2_2$, as shown in FIG. 9. The highly conductive region 18 has a higher impurity concentration and a higher conductivity than the n⁻ layer $2_1$.

Figure 24:
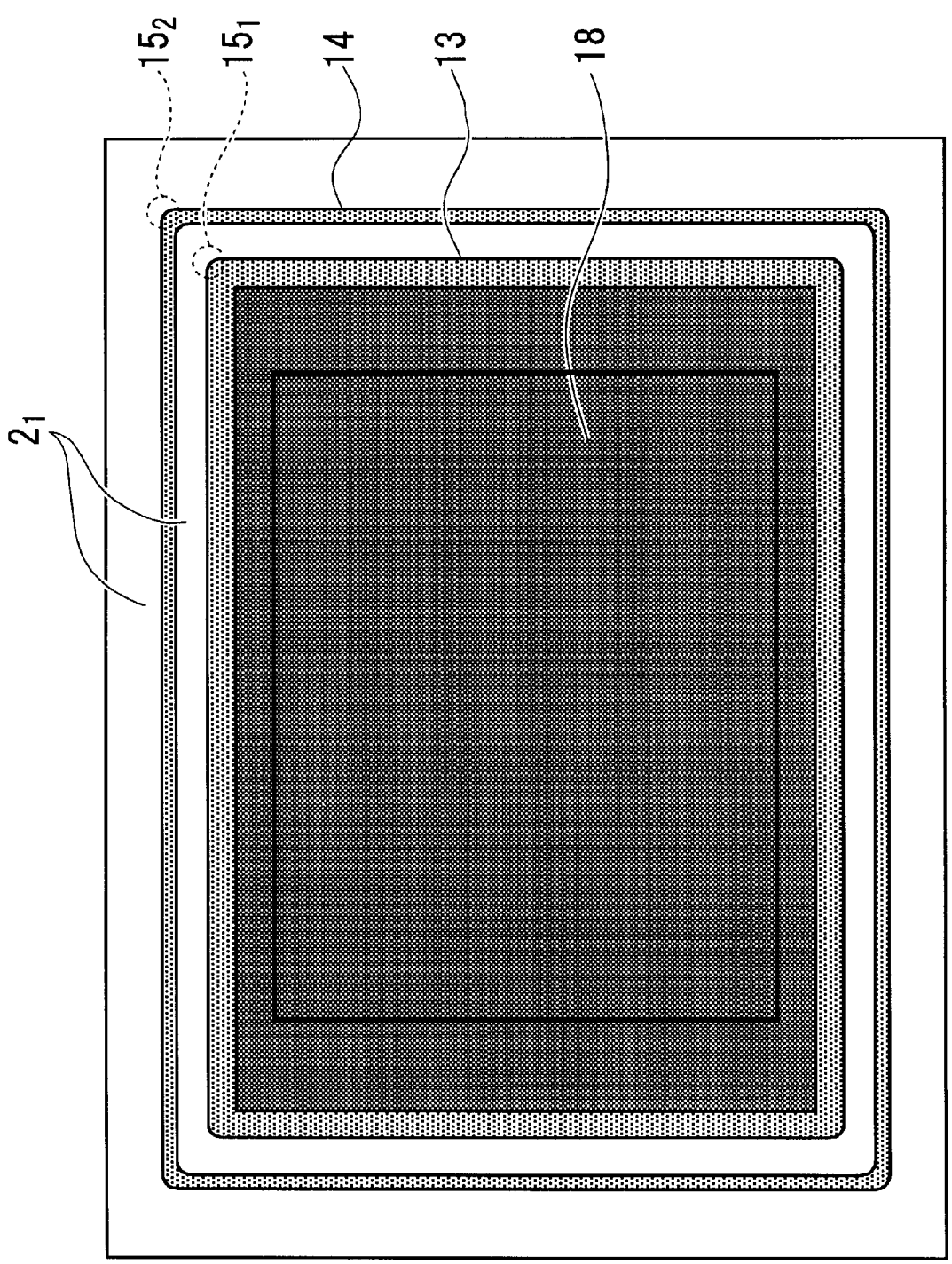
FIG. 24 is a plan view showing a pattern of a highly conductive region.

The highly conductive region 18 is shown in plan in FIG. 24, which corresponds to a cross section taken along line II—II of FIG. 9. The highly conductive region 18 has its outer peripheral edge positioned within the first diffused guard ring layer 13 such that the highly conductive region 18 in its entirety is located within the first diffused guard ring layer 13. The n⁻ layer $2_1$ is disposed between the first and second diffused guard ring layers 13, 14 and outside of the second diffused guard ring layer 14, preventing the withstand voltage of the pn junction from being lowered.

Figure 10:
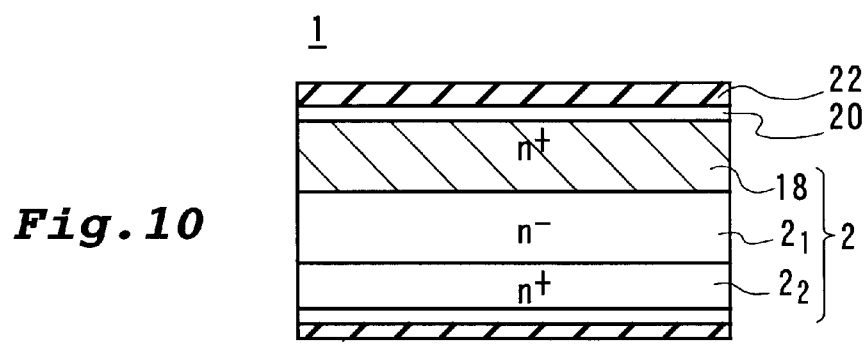
FIG. 10 is a cross-sectional view showing a step of manufacturing the active region, following the step shown in FIG. 9.
Figure 11:
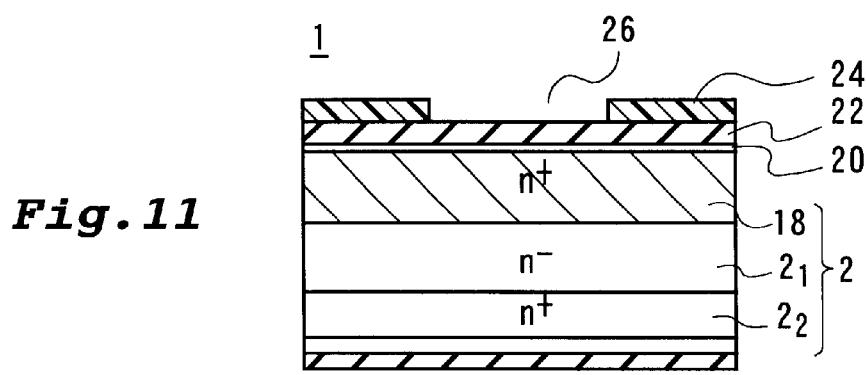
FIG. 11 is a cross-sectional view showing a step of manufacturing the active region, following the step shown in FIG. 10.

Then, a gate electrode film 22 of polysilicon is formed on the entire surface of a gate oxide film 20, as shown in FIG. 10. Thereafter, a patterned resist film 24 is formed, as shown in FIG. 11.

Figure 12:
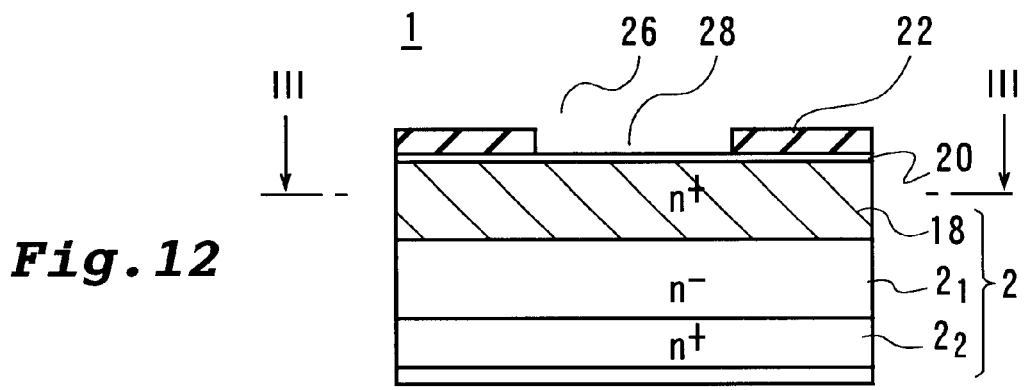
FIG. 12 is a cross-sectional view showing a step of manufacturing the active region, following the step shown in FIG. 11.

The gate oxide film 20 is exposed at the bottom of an opening 26 defined in the resist film 24. After the assembly is etched, the resist film 24 is removed, forming a window 28 in the gate electrode film 22 with the gate oxide film 20 exposed at the bottom of the window 28, as shown in FIG. 12.

Figure 25:
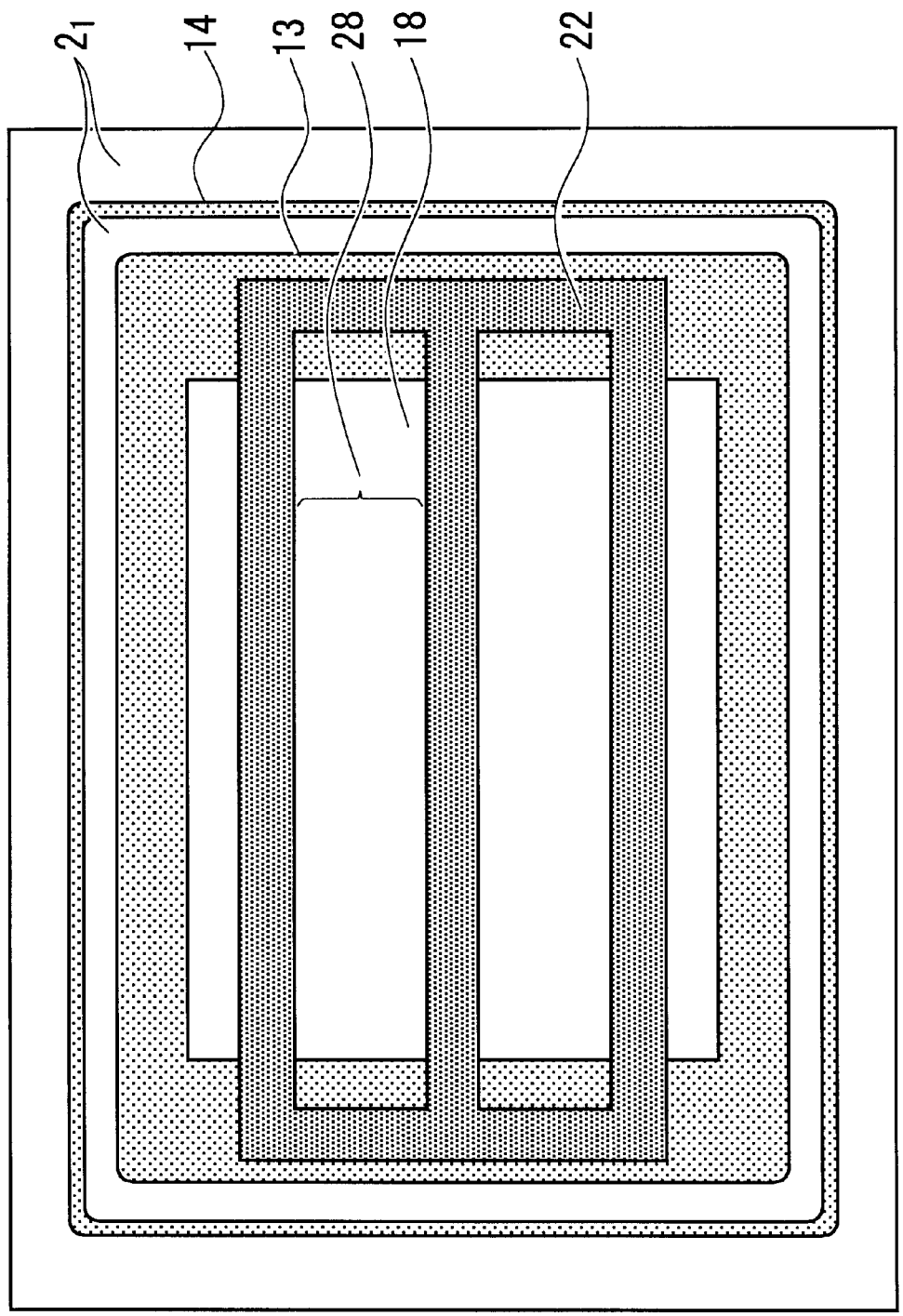
FIG. 25 is a plan view showing a pattern of a gate electrode film (thin film of polysilicon) and a diffused guard ring layer.

The gate electrode film 22 and the diffused layers are shown in plan in FIG. 25. The plan view of the diffused layers corresponds to a cross section taken along line III—III of FIG. 12. In FIG. 25, a plurality of elongate openings 28 are defined in the gate electrode film 22, providing a plurality of slender gate electrode films 22 on the highly conductive region 18.

Figure 13:
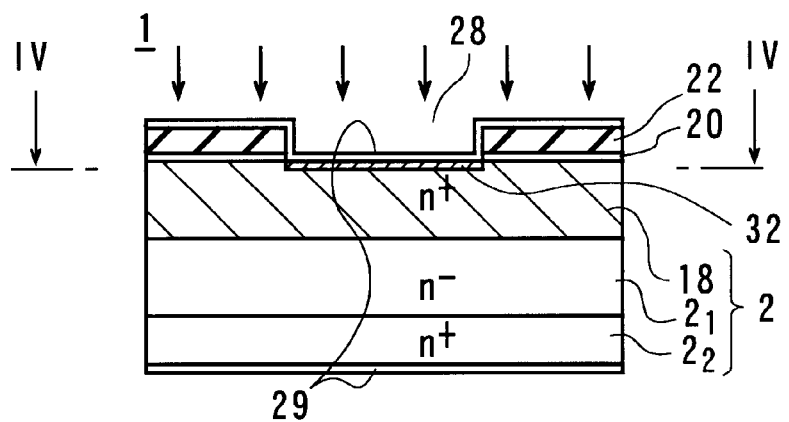
FIG. 13 is a cross-sectional view showing a step of manufacturing the active region, following the step shown in FIG. 12.
Figure 26:
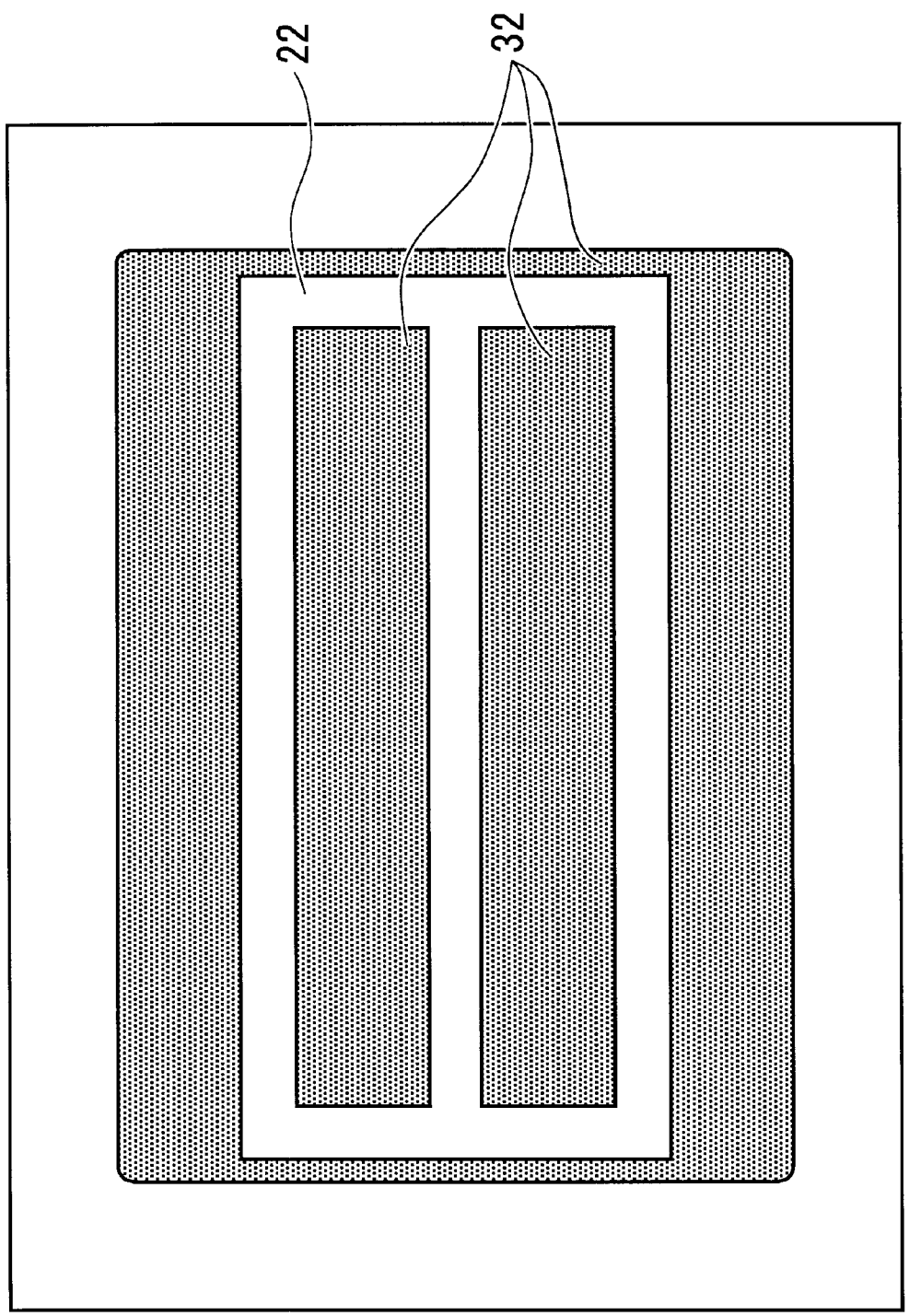
FIG. 26 is a plan view showing a pattern of shallow impurity layer which will become a channel region.

After the gate oxide film 20 exposed at the bottom of the window 28 is reshaped into a thin oxide film 29, the n⁻ layer outside of the first diffused guard ring layer 13 is protected by a resist film (not shown), and then a p-type impurity is injected into the assembly. The impurity which has passed through the thin oxide film 29 produces a shallow p-type impurity layer 32 below the bottom of the window 28 in the surface of the highly conductive region 18, as shown in FIG. 13. The impurity layer 32 is shown in plan in FIG. 26, with the other diffused layers omitted from illustration. FIG. 26 corresponds to a cross section taken along line IV—IV of FIG. 13.

Figure 14:
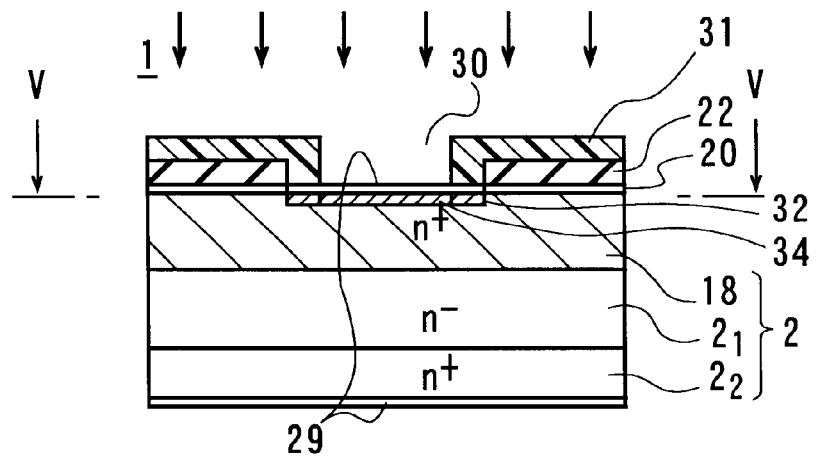
FIG. 14 is a cross-sectional view showing a step of manufacturing the active region, following the step shown in FIG. 13.

A patterned resist film 31 is formed which has an opening 30 defined centrally in the window 28. With the thin oxide film 29 exposed at the bottom of the opening 30, a large amount of p-type impurity is injected to form a shallow impurity layer 34 centrally in the shallow impurity layer 32, as shown in FIG. 14. The shallow impurity layer 34 is of the same conductivity type as and a higher concentration than the shallow impurity layer 32.

Figure 27:
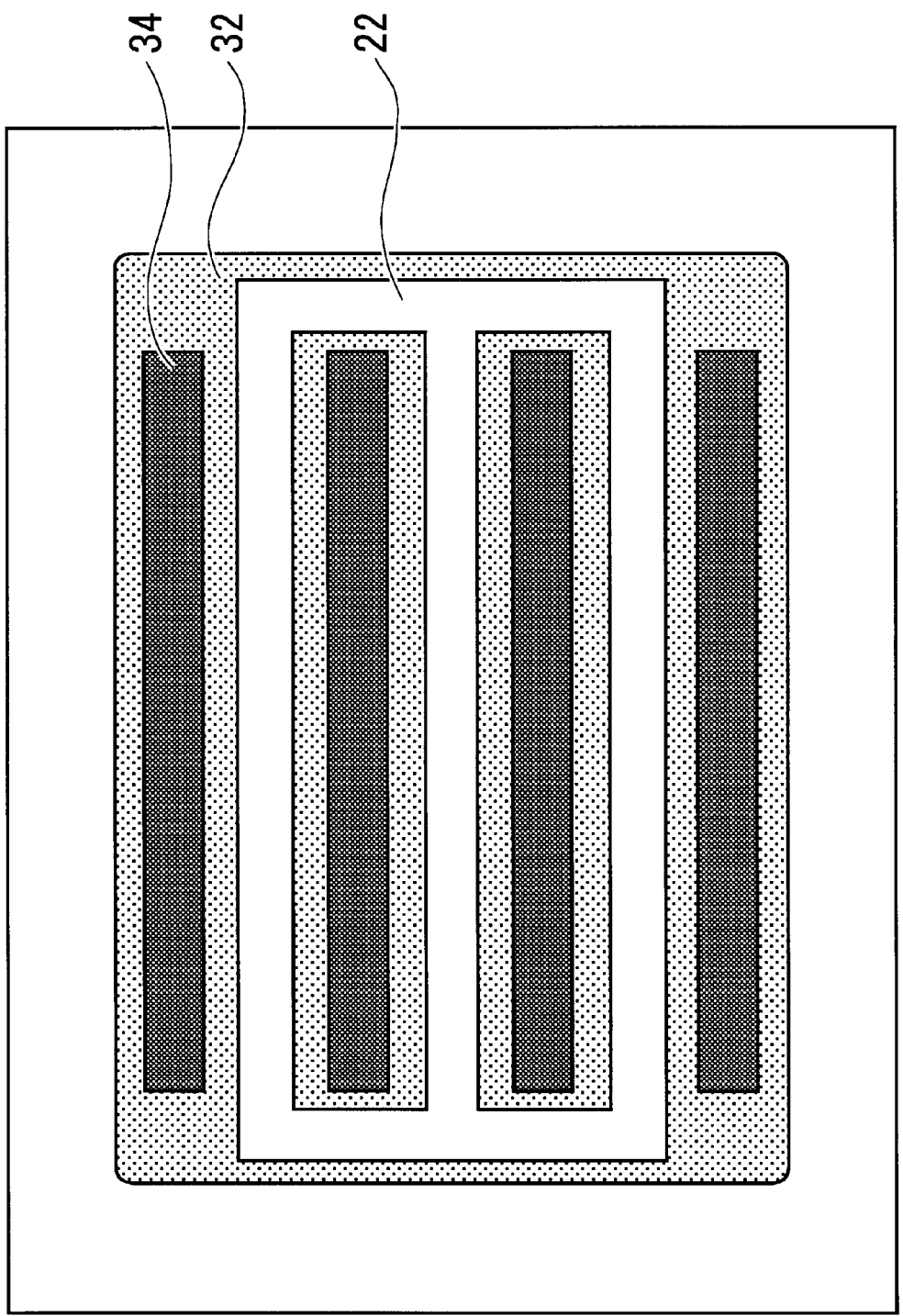
FIG. 27 is a plan view showing a pattern of shallow impurity layer which will become a main diffused layer.

The impurity layer 34 is shown in plan in FIG. 27, which corresponds to a cross section taken along line V—V of FIG. 14.

Figure 15:
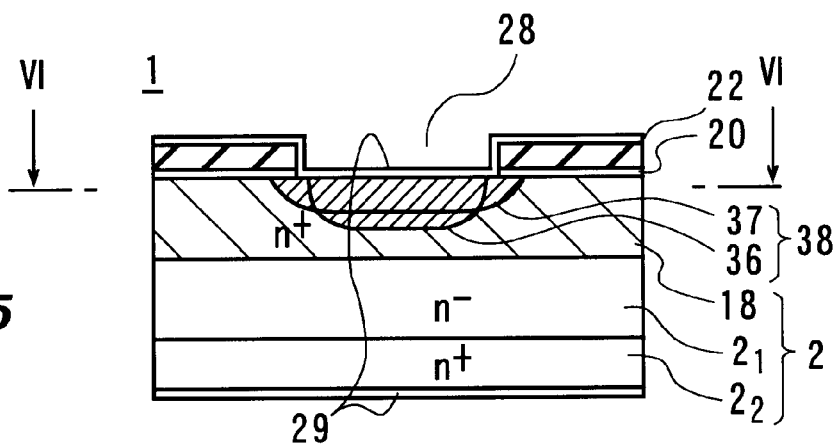
FIG. 15 is a cross-sectional view showing a step of manufacturing the active region, following the step shown in FIG. 14.

After the resist film 31 is removed, the assembly is heat-treated to diffuse the shallow impurity layers 32, 34 to form a p-type diffused base layer 38, as shown in FIG. 15. The diffused base layer 38 comprises a channel region 37 which has been formed by the diffusion of the impurity layer 32 of relatively low concentration and a main diffused layer 36 which has been formed by the diffusion of the impurity layer 34 of relatively high concentration. The depth to which the channel region 37 is diffused and the depth to which the main diffused layer 36 is diffused are related to the concentrations of the shallow impurity layers 32, 34. The main diffused layer 36 is deeper than the channel region 37.

The highly conductive region 18 has been constructed so as to be deeper than the main diffused layer 36. The highly conductive region 18 is positioned between p-type diffused layers 38 each comprising the main diffused layer 36 and the channel region 37. Thus, the effect of a JFET formed between the adjacent diffused layers 38 is small.

When the assembly is heat-treated, the channel region 37 and the main diffused layer 36 are diffused laterally also. While the channel region 37 enters beneath the bottom of the gate electrode film 22, the main diffused layer 36 does not enter beneath the bottom of the gate electrode film 22.

Figure 28:
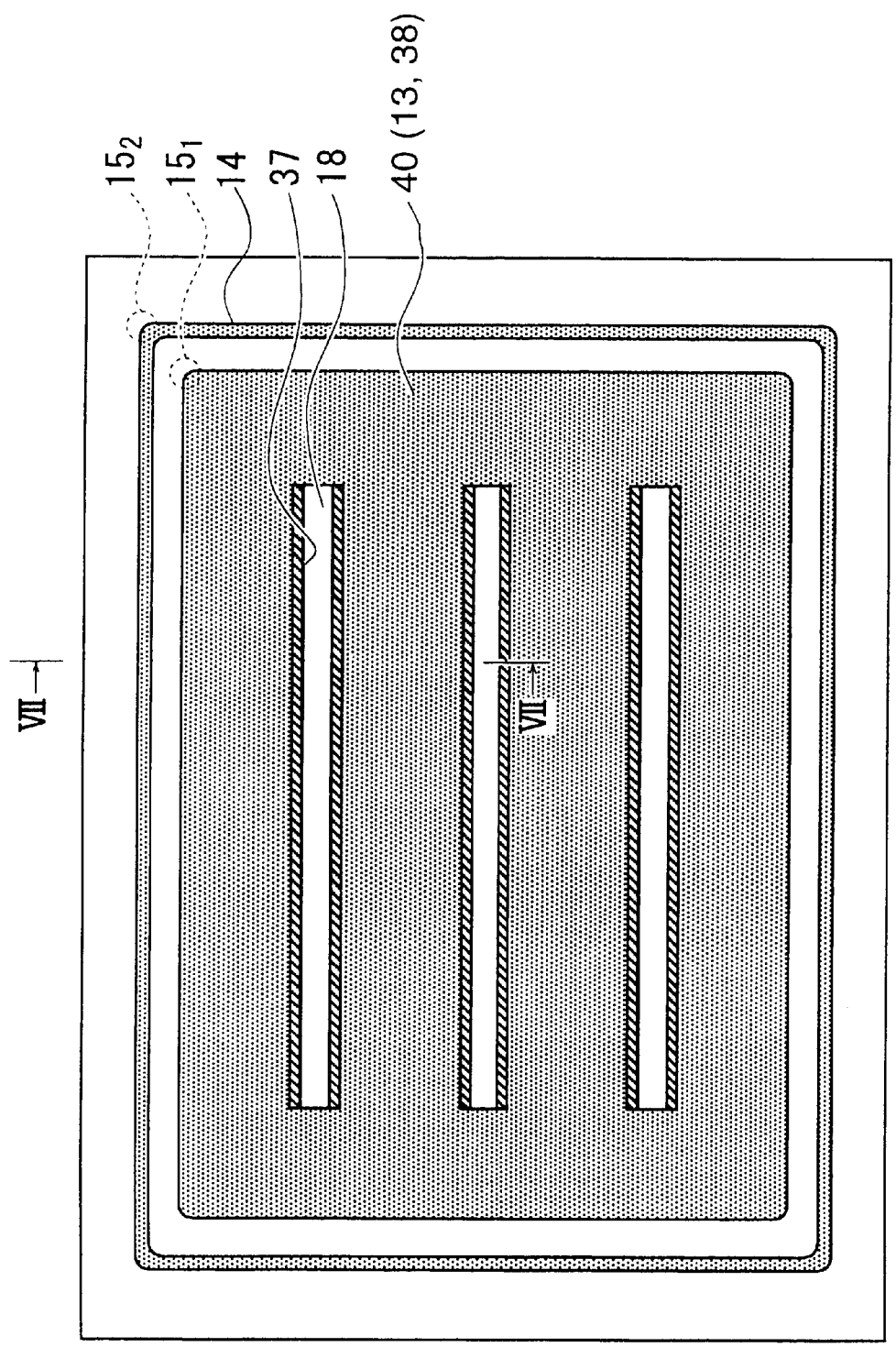
FIG. 28 is a plan view showing the positional relationship between a channel region and a highly conductive region.

Since the amount by which the channel region 37 is diffused laterally is small, the highly conductive region 18 remains in a central portion beneath the bottom of the gate electrode film 22. FIG. 28 shows in plan the positional relationship among the highly conductive region 18, the main diffused layer 36, and the channel region 37.

FIG. 28 corresponds to a cross section taken along line VI—VI of FIG. 15. A p-type diffused layer 40 is constructed of the first diffused guard ring layer 13 and the diffused base layer 38. Since the plural diffused base layers 38 have ends held in contact with the first diffused guard ring layer 13 and are spaced from each other in parallel relationship, the diffused base layers 38 are of a comb-toothed shape.

The p-type diffused layer 40 has an outer peripheral portion serving as the first diffused guard ring layer 13, making a pn junction with the n⁻ layer $2_1$. Inasmuch as the first diffused guard ring layer 13 is deep, it has a high withstand voltage. Because the second diffused guard ring layer 14 is formed as a ring around the first diffused guard ring layer 13, the withstand voltage is rendered higher.

The highly conductive region 18 is of a high concentration and the channel region 37 is diffused to a small depth, so that the withstand voltage of the pn junction between the highly conductive region 18 and the channel region 37 tends to be lower than the withstand voltage of the outer peripheral portion.

In the MOSFET of the above structure, however, no spherical junctions are present as the surface of the highly conductive region 18 is surrounded by the p-type diffused region 38 and the first diffused guard ring layer 13.

The highly conductive region 18 has a lower end (at a deepest position) held in contact with and surrounded by the first diffused guard ring layer 13.

Therefore, a depletion layer spreading from the pn junction between the highly conductive region 18 and the channel region 37 extends into the highly conductive region 18, and its breakdown voltage is determined by the withstand voltage of the cylindrical junction of the channel region 37. According to the present invention, therefore, the withstand voltage is much higher than the withstand voltage determined by the spherical junction of the channel region.

Figure 16:
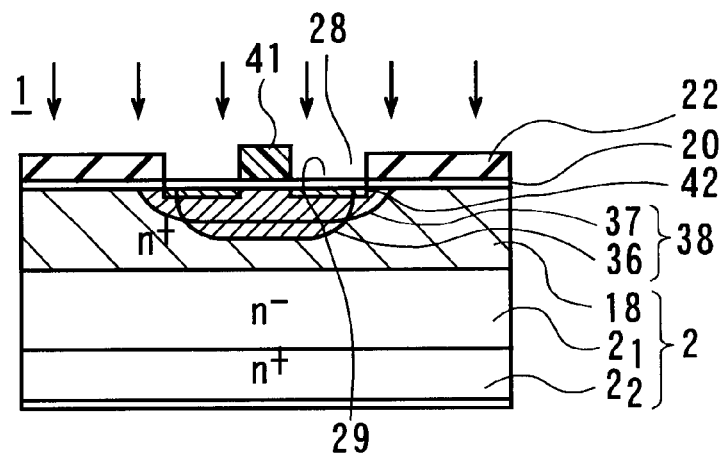
FIG. 16 is a cross-sectional view showing a step of manufacturing the active region, following the step shown in FIG. 15

After a resist film 41 is formed centrally on the main diffused layer 36 and the channel region 37, an n-type impurity is injected using the resist film 41 and the gate electrode film 22 as a mask. Now, a shallow n⁺ layer 42 having a high concentration is formed in the diffused base layer 38 that comprises the main diffused layer 36 and the channel region 37, as shown in FIG. 16.

Figure 17:
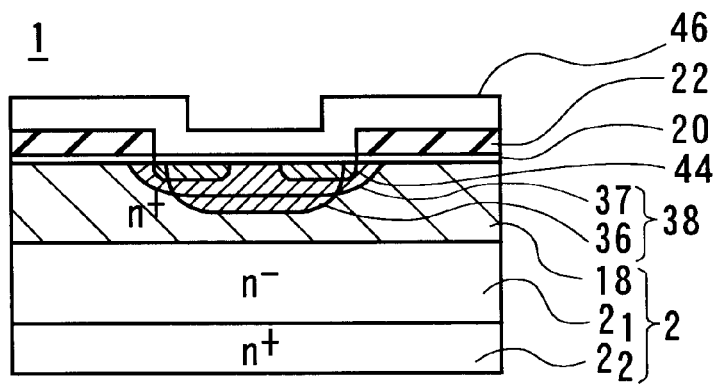
FIG. 17 is a cross-sectional view showing a step of manufacturing the active region, following the step shown in FIG. 16.

After the resist film 41 is removed, the shallow n⁺ layer 42 is diffused, forming an n⁺-type diffused source layer 44 in the p-type diffused base layer 38, as shown in FIG. 17. When the shallow n⁺ layer 42 is diffused, forming the diffused source layer 44, the n⁺ impurity is diffused laterally and enters the bottom of the gate electrode film 22. Therefore, the diffused source layer 44 enters beneath the bottom of the gate electrode film 22. When a positive voltage is applied to the gate electrode film 22 to develop an n-type inverted layer in the surface of the channel region 37, the diffused source layer 44 is connected to the highly conductive region 18 by the inverted layer.

Figure 18:
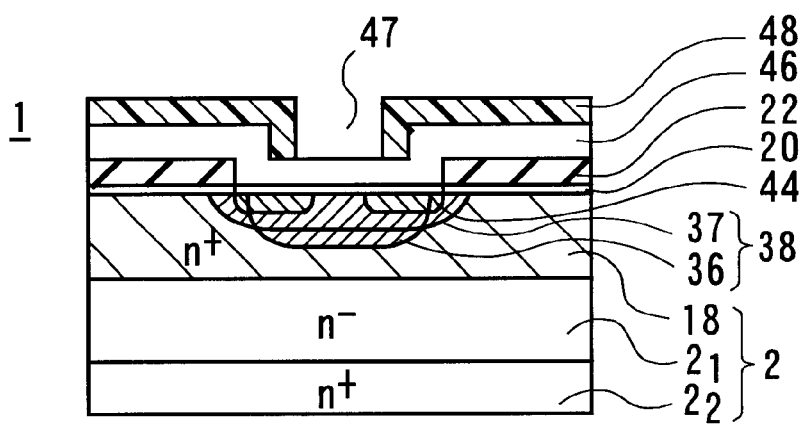
FIG. 18 is a cross-sectional view showing a step of manufacturing the active region, following the step shown in FIG. 17.
Figure 19:
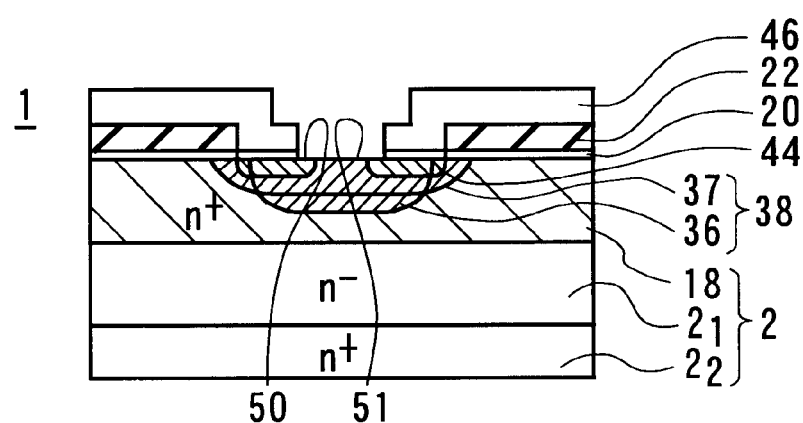
FIG. 19 is a cross-sectional view showing a step of manufacturing the active region, following the step shown in FIG. 18.

After the diffused source layer 44 is formed, an interlayer insulating film 46 (see FIG. 17) is formed. As shown in FIG. 18, a patterned resist film 48 is formed on the interlayer insulating film 47, with an opening 47 defined therein over an inner peripheral portion of the diffused source layer 44 and above the main diffused layer The assembly is then etched to remove the interlayer insulating film 46 exposed at the bottom of the opening 47. As a result, a surface 50 of the inner peripheral portion of the diffused source layer 44 and a surface 51 of the main diffused layer 36 surrounded by the diffused source layer 44 are exposed, as shown in FIG. 19.

Figure 20:
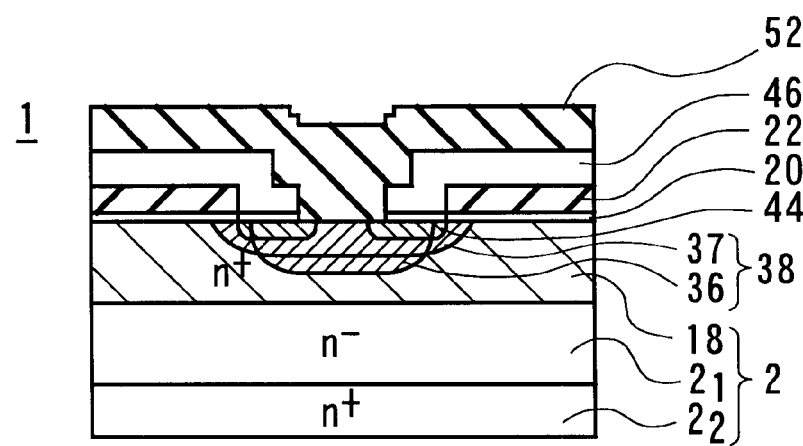
FIG. 20 is a cross-sectional view showing a step of manufacturing the active region, following the step shown in FIG. 19.

Then, a thin metal film 52 is formed, providing a short circuit between the diffused source layer 44 and the diffused base layer 38 (the main diffused layer 36 and the channel region 37), as shown in FIG. 20.

Thereafter, the thin metal film 52 is etched to form a gate electrode film connected to the gate electrode film 22 and a source electrode film connected to the diffused source layer 44. After a protective film is formed if necessary, a drain electrode film is formed on the surface of the n⁺ layer $2_2$ on the back side of the drain layer 2. In this manner, the semiconductor chip 1 of MOSFET is completed.

Figure 21:
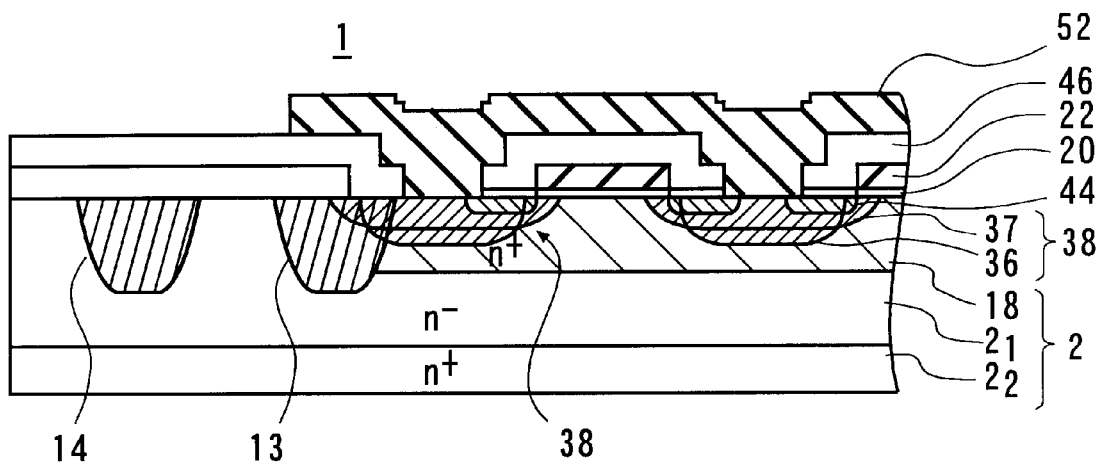
FIG. 21 is a fragmentary cross-sectional view of a semiconductor chip according to an embodiment of the present invention.

The withstand voltage and active regions of the semiconductor chip 1 are shown in cross section in FIG. 21. FIG. 21 corresponds to a cross section taken along line VII—VII of FIG. 28.

In the above embodiment, the first conductivity type is the n type, and the second conductivity type may be the p type. However, the first conductivity type may be the p type, and the second conductivity type is the n type.

Figure 29:
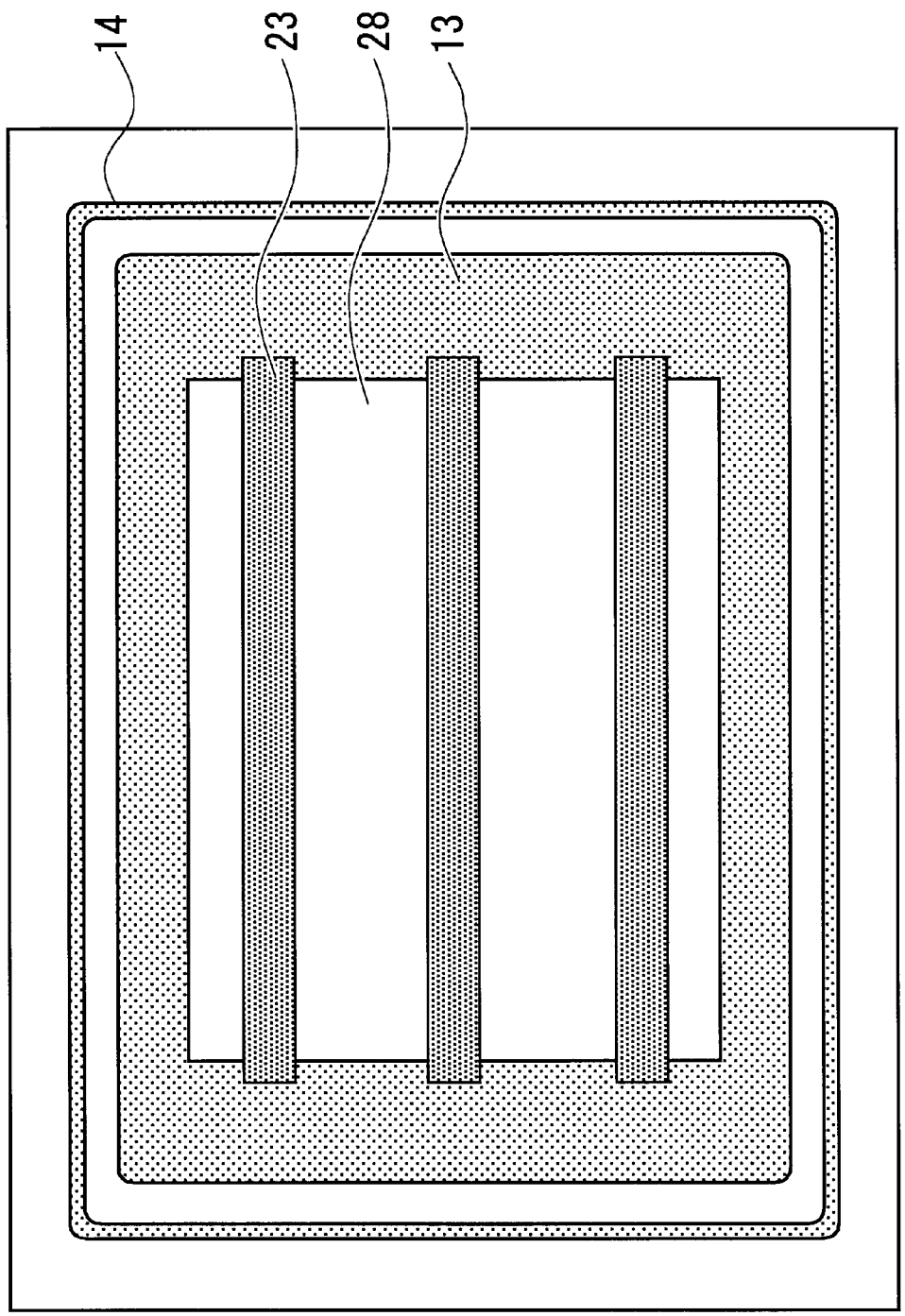
FIG. 29 is a plan view showing another pattern of a gate electrode film (thin film of polysilicon)
Figure 30:
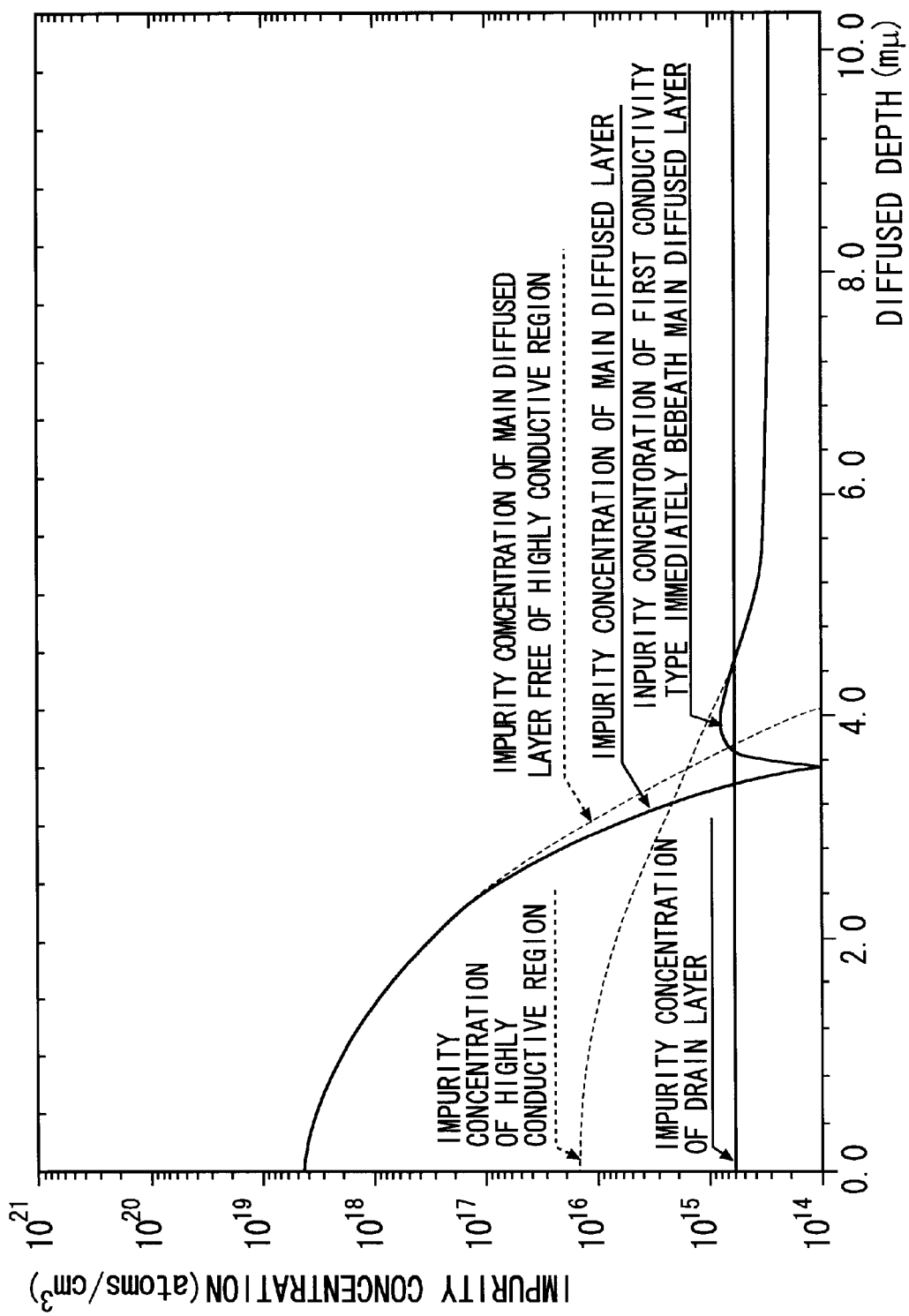
FIG. 30 is a graph showing an impurity concentration distribution in the direction of a depth.
Figure 31:
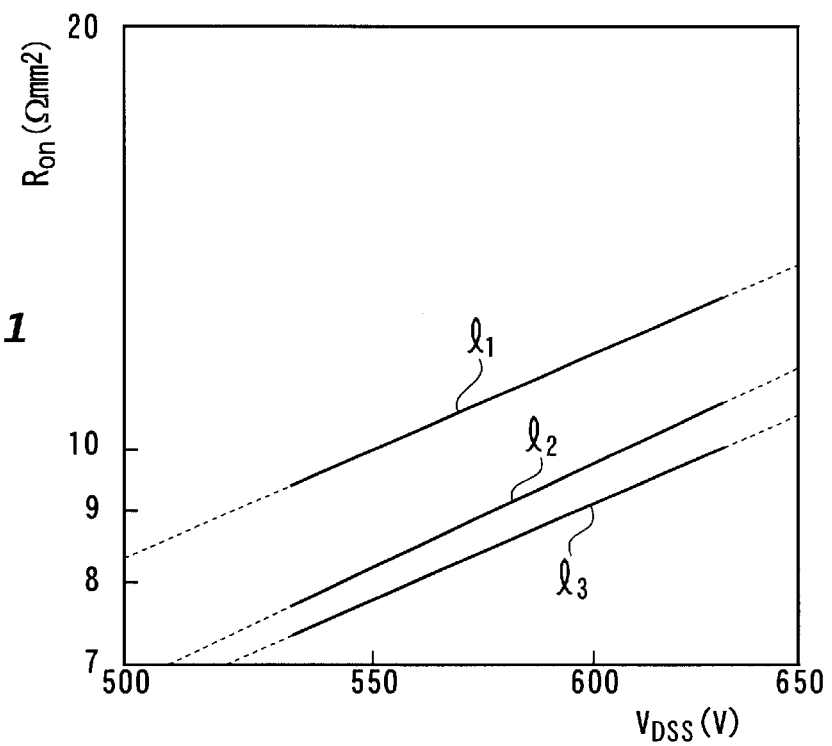
FIG. 31 is a graph showing the relationship between the depth of the highly conductive region and a conducting resistance.
Figure 32A:
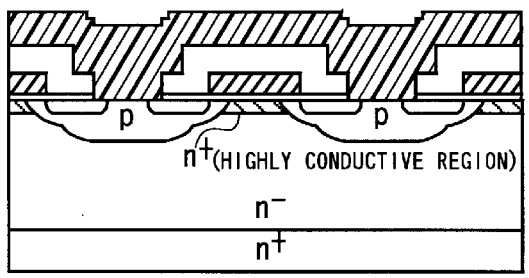
FIG. 32a is a cross-sectional view showing a structure represented by the characteristic of a straight line $l_1$ shown in FIG. 31.
Figure 32B:
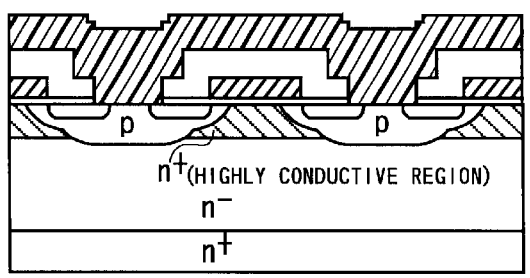
FIG. 32b is a cross-sectional view showing a structure represented by the characteristic of a straight line $l_2$ shown in FIG. 31.
Figure 32C:
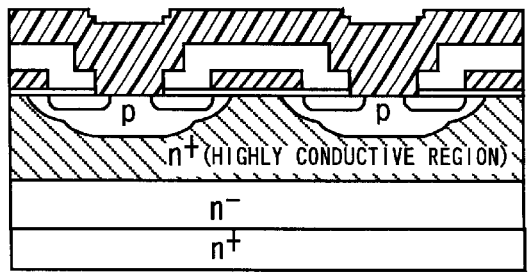
FIG. 32c is a cross-sectional view showing a structure represented by the characteristic of a straight line $l_3$ shown in FIG. 31.
Figure 33:
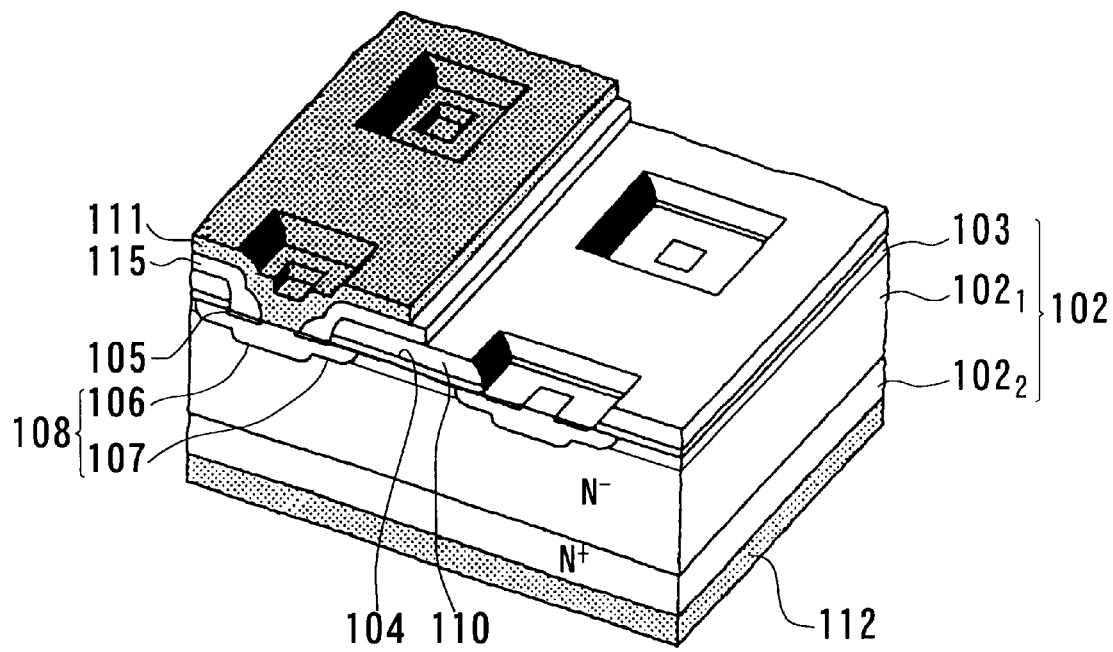
FIG. 33 is a perspective view of a conventional MOSFET.
Figure 34:
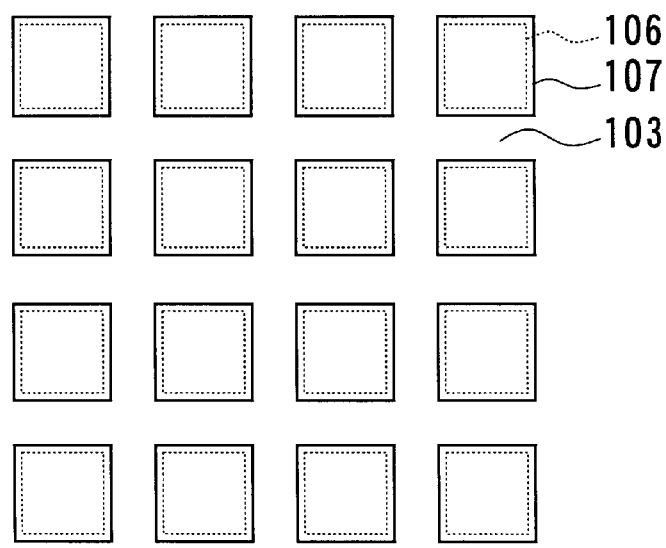
FIG. 34 is a plan view showing the positional relationship between a highly conductive region and p-type regions of the conventional MOSFET.
Figure 35A:
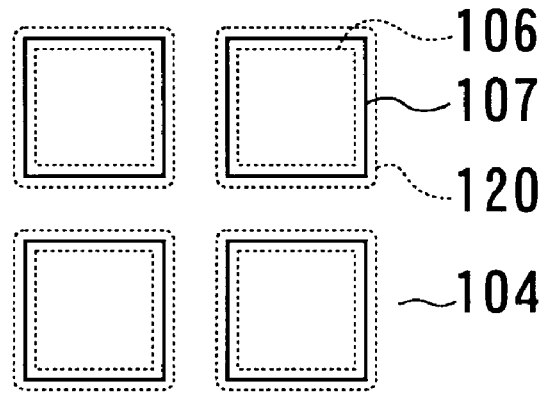
FIG. 35a is a plan view illustrative of the manner in which depletion layers start being spread into the highly conductive region.
Figure 35B:
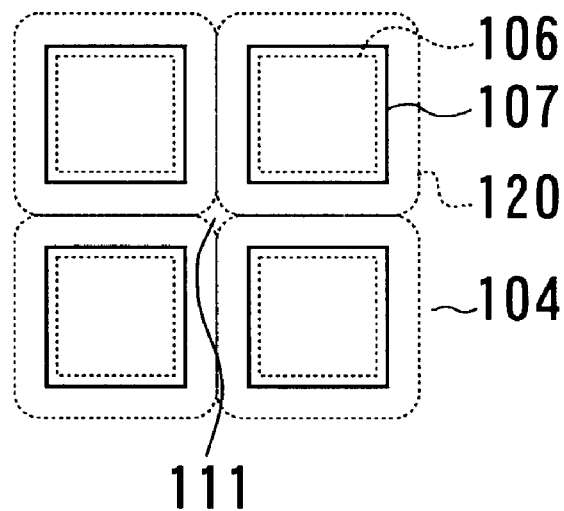
FIG. 35b is a plan view illustrative of the manner in which the depletion layers are connected together.

The gate electrode films 22 are connected to each other. However, according to the present invention, insofar as the highly conductive region 18 connected to the diffused source layer 44 by the inverted layer which is formed in the surface of the channel region 37 is surrounded by the p-type region 38 and the first and second diffused guard ring layers 13, 14, and the depletion layer of the highly conductive region 18 spreads inwardly in the surface of the highly conductive region 18, the gate electrode films may be separate from each other, as is the case with three separate gate electrode films 23 shown in FIG. 29.

In the semiconductor device according to the present invention, as described above, the surface of the highly conductive region is surrounded by the diffused base layer which is of the conductivity type opposite to the conductivity type of the highly conductive region and another diffused layer whose conductivity type is the same as the conductivity type of the diffused base layer. Therefore, the highly conductive region does not form spherical junctions, and can have its withstand voltage increased.

The above MOSFET is in the form of a semiconductor chip. However, the present invention includes a semiconductor device itself which comprises a sealed semiconductor chip. The present invention also covers semiconductor devices of IGBT and other structures in addition to the MOSFET.

Figure 22:
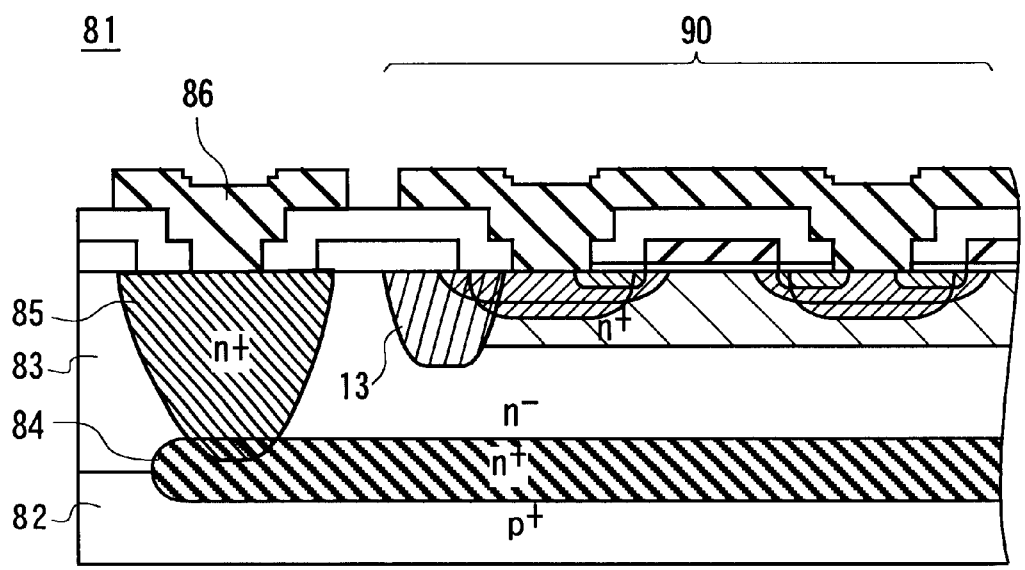
FIG. 22 is a fragmentary cross-sectional view of a semiconductor device according to another embodiment of the present invention.

An IC including a MOSFET of the above structure also falls in the scope of the present invention. A semiconductor device 81 shown in FIG. 22 is an example of such an IC. As shown in FIG. 22, the semiconductor device 81 has a MOSFET region 90 which is of the above structure. The semiconductor device 81 also has an n⁻-type silicon epitaxial layer 83 on the surface of a p⁺-type silicon substrate 82 with an n⁺-type embedded layer 84 disposed between the silicon substrate 82 and the epitaxial layer 83. An n⁺-type high-concentration layer 85 is diffused in the epitaxial layer 83 from the surface thereof, with a 25 drain electrode 86 disposed on the surface of the high-concentration layer 85. The semiconductor device 81 also has a p⁺-type high-concentration diffused layer disposed outside of the high-concentration layer 85 and extending from the surface to the silicon substrate 82. The high-concentration diffused layer separates the MOSFET region 90 from a circuit region. Electrodes in the circuit region and the drain electrode (and source and gate electrodes) are formed on the same surface.

The principles of the present invention are also applicable to the semiconductor device 81 of the above structure.

While the invention has been particularly shown and described in reference to preferred embodiments thereof, it will be understood by those skilled in the art that changes in form and details may be made therein without departing from the spirit and scope of the invention.

Since no spherical junctions are present in the highly conductive region, the withstand voltage is high. The semiconductor device according to the present invention is thus suitable for high-voltage switching applications.

What is claimed is:

1. A semiconductor device comprising:
   a drain layer of a first conductivity type formed in a semiconductor substrate, the first conductivity type being either a p type or an n type of semiconductor, and a second conductivity type being the other of the p type or the n type;
   a diffused base layer of the second conductivity type formed in a surface of said drain layer; and
   a diffused source layer of the first conductivity type formed in a surface of said diffused base layer;
   said diffused base layer having a portion as a channel region between said diffused source layer and said drain layer;
   said channel region having on a surface thereof a gate insulating film and a gate electrode film;
   wherein when a voltage is applied to said gate electrode film, forming an inverted layer in the surface of said channel region, said diffused source layer and said drain layer are electrically connected to each other by said inverted layer;
   wherein:
      at least a portion of said drain layer which is connected to the diffused source layer by said inverted layer has a highly conductive region having a resistance lower than the remainder of said drain layer and the same conductivity type as the remainder of said drain layer;
      said highly conductive region having a surface surrounded by a diffused layer of the second conductivity type including said diffused base layer; and
      wherein said diffused base layer has a main diffused layer which is of the same conductivity type as said diffused base layer and is diffused to a depth greater than said diffused base layer, said highly conductive region being diffused to a depth greater than the depth to which said main diffused layer is diffused.

2. A semiconductor device according to claim 1, wherein the surface of said highly conductive region is divided into a plurality of regions by the diffused layer of the second conductivity type including said diffused base layer.

3. A semiconductor device according to claim 2, wherein said diffused base layer has a main diffused layer which is of the same conductivity type as said diffused base layer and is diffused to a depth greater than said diffused base layer, said highly conductive region being diffused to a depth greater than the depth to which said main diffused layer is diffused.

4. A semiconductor device according to claim 3, further comprising a diffused guard ring layer disposed around an outer peripheral portion of said diffused base layer, said diffused guard ring layer being of the same conductivity type as said diffused base layer and diffused to a depth greater than the depth to which said main diffused layer is diffused, the surface of said highly conductive region having an outer peripheral portion held in contact with said diffused layer of the second conductivity type.

5. A semiconductor device according to claim 2, further comprising a drain electrode film disposed on either a face side or a back side of said semiconductor substrate and electrically connected to said drain layer.

6. A semiconductor device according to claim 3, further comprising a drain electrode film disposed on either a face side or a back side of said semiconductor substrate and electrically connected to said drain layer.

7. A semiconductor device according to claim 1, further comprising a diffused guard ring layer disposed around an outer peripheral portion of said diffused base layer, said diffused guard ring layer being of the same conductivity type as said diffused base layer and diffused to a depth greater than the depth to which said main diffused layer is diffused, the surface of said highly conductive region having an outer peripheral portion held in contact with said diffused layer of the second conductivity type.

8. A semiconductor device according to claim 7, further comprising a drain electrode film disposed on either a face side or a back side of said semiconductor substrate and electrically connected to said drain layer.

9. A semiconductor device according to claim 1, further comprising a drain electrode film disposed on either a face side or a back side of said semiconductor substrate and electrically connected to said drain layer.

10. A semiconductor device according to claim 9, further comprising a drain electrode film disposed on either a face side or a back side of said semiconductor substrate and electrically connected to said drain layer.

11. A semiconductor device according to claim 1, further comprising a drain electrode film disposed on either a face side or a back side of said semiconductor substrate and electrically connected to said drain layer.

12. A semiconductor device having:
- a drain layer of a first conductivity type formed in a semiconductor substrate, the first conductivity type being either a p type or an n type of semiconductor, and a second conductivity type being the other of the p type or the n type;
- a diffused base layer of the second conductivity type formed in a surface of said drain layer; and
- a diffused source layer of the first conductivity type formed in a surface of said diffused base layer;
- said diffused base layer having a portion as a channel region between said diffused source layer and said drain layer;
- said channel region having on a surface thereof a gate insulating film and a gate electrode film;
- wherein when a voltage is applied to said gate electrode film, forming an inverted layer in the surface of said channel region, said diffused source layer and said drain layer are electrically connected to each other by said inverted layer;
- wherein:
  - at least a portion of said drain layer which is connected to the diffused source layer by said inverted layer has a highly conductive region having a resistance lower than the reminder of said drain layer and the same conductivity type as the reminder of said drain layer;
  - said highly conductive region having a surface surrounded by a diffused layer of the second conductivity type including said diffused base layer;
  - a diffused guard ring layer disposed around an outer peripheral portion of said diffused base layer;
  - wherein:
    - said diffused guard ring layer being of the same conductivity type as said diffused base layer, and said diffused guard ring layer has the same depth as said diffused layer of the second conductivity type, and
    - said highly conductive region has a depth smaller than the depth of said diffused guard ring layer.

13. A semiconductor device according to claim 12, wherein the surface of said highly conductive region is divided into a plurality of regions by the diffused layer of the second conductivity type including said diffused base layer.

14. A semiconductor device according to claim 13, wherein said diffused base layer has a main diffused layer which is of the same conductivity type as said diffused base layer and is diffused to a depth greater than said diffused base layer, said highly conductive region being diffused to a depth greater than the depth to which said main diffused layer is diffused.

15. A semiconductor device according to claim 14, wherein the surface of said highly conductive region has an outer peripheral portion held in contact with said diffused layer of the second conductivity type.

16. A semiconductor device according to claim 14, further comprising a drain electrode film disposed on either a face side or a back side of said semiconductor substrate and electrically connected to said drain layer.

17. A semiconductor device according to claim 13, further comprising a drain electrode film disposed on either a face side or a back side of said semiconductor substrate and electrically connected to said drain layer.

18. A semiconductor device according to claim 12, wherein said diffused base layer has a main diffused layer which is of the same conductivity type as said diffused base layer and is diffused to a depth greater than said diffused base layer, said highly conductive region being diffused to a depth greater than the depth to which said main diffused layer is diffused.

19. A semiconductor device according to claim 18, wherein the surface of said highly conductive region has an outer peripheral portion held in contact with said diffused layer of the second conductivity type.

20. A semiconductor device according to claim 19, further comprising a drain electrode film disposed on either a face side or a back side of said semiconductor substrate and electrically connected to said drain layer.

21. A semiconductor device according to claim 18, further comprising a drain electrode film disposed on either a face side or a back side of said semiconductor substrate and electrically connected to said drain layer.

22. A semiconductor device according to claim 12, further comprising a drain electrode film disposed on either a face side or a back side of said semiconductor substrate and electrically connected to said drain layer.

23. A semiconductor device according to claim 22, further comprising a drain electrode film disposed on either a face side or a back side of said semiconductor substrate and electrically connected to said drain layer.

* * * * *